United States Patent
Tanaka et al.

(10) Patent No.: US 8,471,631 B2
(45) Date of Patent: Jun. 25, 2013

(54) BIAS CIRCUIT, POWER AMPLIFIER, AND CURRENT MIRROR CIRCUIT

(75) Inventors: Satoshi Tanaka, Kanagawa (JP); Fuminori Morisawa, Kanagawa (JP); Makoto Tabei, Kanagawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 162 days.

(21) Appl. No.: 13/089,454

(22) Filed: Apr. 19, 2011

(65) Prior Publication Data

US 2011/0260796 A1    Oct. 27, 2011

(30) Foreign Application Priority Data

Apr. 27, 2010 (JP) .................................. 2010-102403

(51) Int. Cl.
*H03F 3/68* (2006.01)
(52) U.S. Cl.
USPC .................. 330/85; 330/260; 330/288; 330/9
(58) Field of Classification Search
USPC ....................................... 330/85, 260, 288, 9
See application file for complete search history.

(56) References Cited

U.S. PATENT DOCUMENTS

| | | | | |
|---|---|---|---|---|
| 4,423,387 A | * | 12/1983 | Sempel | 330/85 |
| 5,673,002 A | * | 9/1997 | Kobayashi et al. | 330/288 |
| 6,587,000 B2 | * | 7/2003 | Oikawa | 330/288 |
| 6,919,762 B2 | * | 7/2005 | Akamine et al. | 330/133 |
| 7,385,446 B2 | * | 6/2008 | Moyer | 330/110 |
| 7,443,226 B1 | * | 10/2008 | Holloway et al. | 327/513 |
| 2003/0160649 A1 | * | 8/2003 | Nakai | 327/540 |
| 2003/0210094 A1 | * | 11/2003 | Lee et al. | 330/264 |
| 2010/0117619 A1 | | 5/2010 | Kudo | |

FOREIGN PATENT DOCUMENTS

WO    2009/037762 A1    3/2009

\* cited by examiner

*Primary Examiner* — Patricia Nguyen
(74) *Attorney, Agent, or Firm* — Mattingly & Malur, PC

(57) ABSTRACT

There is provided a bias circuit that can operate even at low voltage and control a current reflecting a change in drain voltage. A first current mirror circuit for feeding back a drain terminal current of an FET which receives an output of an operational amplifier at a gate terminal to an input terminal of the operational amplifier and a second current mirror circuit are coupled in parallel. A variable voltage is coupled to the first current mirror circuit, and a fixed voltage is coupled to the second current mirror circuit. Even if the variable voltage becomes lower than the threshold voltage of FETs configuring the first current mirror circuit, the second current mirror circuit feeds back the current to the input terminal of the operational amplifier with reliability.

13 Claims, 20 Drawing Sheets

BIAS CIRCUIT, POWER AMPLIFIER, AND CURRENT MIRROR CIRCUIT

CROSS-REFERENCE TO RELATED APPLICATIONS

The disclosure of Japanese Patent Application No. 2010-102403 filed on Apr. 27, 2010 including the specification, drawings and abstract is incorporated herein by reference in its entirety.

BACKGROUND

The present invention relates to a power amplifier in a cellular phone unit that uses two or more frequency bands, and more particularly to a method for reducing the threshold of an FET used in a bias circuit.

A current mirror circuit is a circuit for controlling and passing a current determined by an FET size ratio with respect to a reference current IREF. FIG. 1 is a circuit diagram showing the configuration of a typical current mirror circuit.

A constant current $I_1$ in the current mirror circuit is expressed by the following equation.

$$I_1 = \beta \times (V_{G1} - V_{th})^2 \tag{1}$$

where $\beta$ denotes a coefficient, $V_{G1}$ denotes the gate terminal voltage of the current mirror circuit, and $V_{th}$ denotes the threshold voltage of the FET configuring the current mirror circuit. The coefficient $\beta$ is expressed by the following equation.

$$\beta \propto \frac{W}{L} \mu C_{ox} \tag{2}$$

where W denotes the gate width of the FET in FIG. 1, L denotes a gate length, $\mu$ denotes a mobility, and $C_{ox}$ denotes an oxide film capacitance.

By modifying equation (1), the gate terminal voltage $V_{G1}$ is expressed as follows.

$$V_{G1} = \sqrt{\frac{I_1}{\beta}} + V_{th} \tag{3}$$

From these relations, a transconductance $gm_1$ can be obtained as follows.

$$gm_1 = 2 \times \beta \times (V_{G1} - V_{th}) = 2 \times \sqrt{\beta} \times (I_1)^{\frac{1}{2}} \tag{4}$$

With the past bias method expressed by the above equations, it is theoretically possible to control an accurate transconductance by controlling the amount of current.

However, in reality, a drain modulation effect shown in FIG. 2 is produced on the FET. FIG. 2 is a graph showing the drain modulation effect of the FET.

The drain modulation effect refers to the phenomenon that the conductance increases in proportion to the gate voltage as the thickness of an inversion layer between the source and the drain increases in proportion to the gate voltage.

In the graph of FIG. 2, the horizontal axis represents a source-drain voltage $V_{DS}$, and the vertical axis represents a current $I_D$ flowing through a drain terminal. In the graph of FIG. 2, ideal values are indicated by solid lines, and actual measurement values are indicated by broken lines.

As is obvious from FIG. 2, in theory, the FET should maintain a constant current in the saturation region. However, in reality, the source-drain current $I_D$ is affected by a gate-drain voltage and increases proportionally. In FIG. 2, the difference between points B and C is the difference between theoretical and actual values.

A current $I_D$ based on the actual measurement values is expressed by the following equation.

$$I_D = \beta \times (V_{G1} - V_{th})^2 \times (1 + \lambda V_{DS}) \tag{5}$$

where $V_{DS}$ denotes a drain-source voltage, and $\lambda$ denotes a drain modulation coefficient.

From the foregoing, a transconductance is derived as follows.

$$\begin{aligned} gm &= 2 \times \beta \times (1 + \lambda V_{DS}) \times (V_{G1} - V_{th}) \\ &= 2 \times \beta \times (1 + \lambda V_{DS}) \times \frac{\sqrt{I_D}}{\sqrt{\beta \times (1 + \lambda V_{DS})}} \\ &= 2 \times \sqrt{\beta \times (1 + \lambda V_{DS})} \times \sqrt{I_D} \end{aligned} \tag{6}$$

There have been proposed various modification methods for the ideal values and actual measurement values.

Past known devices include a cascode current mirror circuit. This is designed to cancel the drain modulation effect by equalizing the source-drain voltages of an FET to which the reference current IREF is inputted and an FET which outputs a current equal to the reference current IREF. The use the cascode current mirror circuit is known as described in International Publication WO2009/037762A1.

SUMMARY

However, the cascode current mirror circuit has a larger circuit size and a higher minimum acceptable voltage.

Further, merely the use of the cascode current mirror circuit does not enable control reflecting the drain modulation effect.

It is an object of the present invention to provide a bias circuit that can operate even at low voltage and control a current reflecting a change in drain voltage.

The above and other objects and novel features of the present invention will become apparent from the description of this specification and the accompanying drawings.

A typical aspect of the invention disclosed in the present application will be briefly described as follows.

A bias circuit according to a typical embodiment of the invention includes an operational amplifier, an FET which operates with an output of the operational amplifier inputted to a gate terminal of the FET, and a current mirror circuit for feeding back a current flowing through a drain terminal of the FET to one input terminal of the operational amplifier. FETs configuring the current mirror circuit are a four-terminal type having a back-gate terminal, and the back-gate terminals of the FETs are at the same potential.

In the bias circuit, a constant current source may be coupled to the other input terminal of the operational amplifier.

In the bias circuit, a variable current source may be coupled to the other input terminal of the operational amplifier.

In the bias circuit, the current mirror circuit may be configured with P-type FETs, and a potential of the back-gate terminals of the FETs configuring the current mirror circuit may be generated from a potential of source terminals of the FETs configuring the current mirror circuit.

In the bias circuit, the current mirror circuit may be configured with P-type FETs, and a potential of the back-gate terminals of the FETs configuring the current mirror circuit may be generated from a source terminal of another FET which is diode-coupled to a potential of drain terminals of the FETs configuring the current mirror circuit.

Another bias circuit according to the typical embodiment of the invention includes an operational amplifier, a first FET which operates with an output of the operational amplifier inputted to a gate terminal of the first FET, a first current mirror circuit for feeding back a current flowing through a drain terminal of the first FET to one input terminal of the operational amplifier, and a second current mirror circuit which is coupled in parallel to the first current mirror circuit. A variable voltage is inputted to FETs configuring the first current mirror circuit, and a fixed voltage is inputted to FETs configuring the second current mirror circuit.

In the bias circuit, the FETs configuring the first current mirror circuit and the FETs configuring the second current mirror circuit may be a four-terminal type having a back-gate terminal, and the back-gate terminals of the FETs configuring the first current mirror circuit and the FETs configuring the second current mirror circuit may be at substantially the same potential.

In the bias circuit, a constant current source may be coupled to the other input terminal of the operational amplifier.

In the bias circuit, a variable current source may be coupled to the other input terminal of the operational amplifier.

The bias circuit may further include a second FET having a gate terminal to which a signal obtained by adding an output of the operational amplifier to an AC component of an RF signal is inputted, and a drain terminal voltage of the second FET may be the variable voltage.

In the bias circuit, a power supply voltage for driving the operational amplifier may be the fixed voltage.

A power amplifier using the bias circuit also falls within the scope of the invention.

A current mirror circuit according to the invention includes a P-type FET having a back-gate terminal, and it is possible to control a threshold voltage of the P-type FET by operating a back-gate terminal of the P-type FET.

The bias circuit according to the invention utilizes the threshold voltage reduction of the P-type FET by utilizing the back-gate effect. Accordingly, the bias circuit can operate even at low voltage and control a current reflecting a change in drain voltage.

DETAILED DESCRIPTION

Hereinafter, preferred embodiments of the present invention will be described with reference to the accompanying drawings.

First Embodiment

Figure 3:
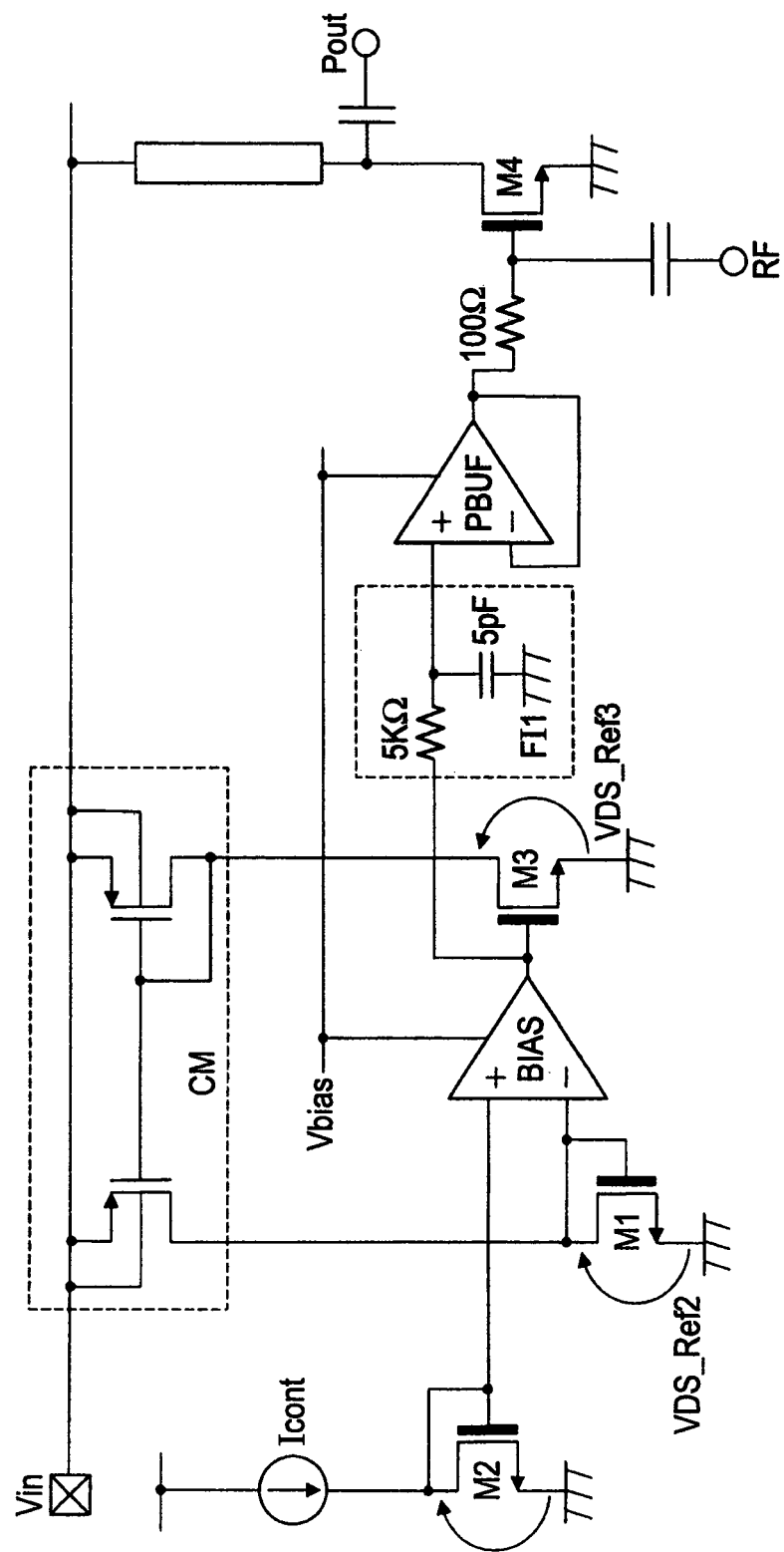
FIG. 3 is a circuit diagram of assistance in explaining the basic operation of a bias circuit according to a first embodiment of the invention.

FIG. 3 is a circuit diagram of assistance in explaining the basic operation of a bias circuit according to a first embodiment of the invention.

The basic configuration of the bias circuit shown in FIG. 3 is the cascade coupling of bias operational amplifiers BIAS and PBUF. These operational amplifiers receive power from a dedicated power supply Vbias.

Diode-coupled FETs M1 and M2 are coupled to the respective input terminals of the operational amplifier BIAS. The FETs M1 and M2 have a diode-coupling structure due to manufacturing process.

A constant current source Icont is coupled to one input terminal (+) of the operational amplifier BIAS. The output of a current mirror circuit CM is inputted to the other input terminal (−) of the operational amplifier BIAS.

The current mirror circuit CM is a current replication circuit for feeding back a current flowing through the drain terminal of an FET M3 derived from the output of the operational amplifier BIAS to the input terminal (−) of the operational amplifier BIAS.

The output terminal of the operational amplifier BIAS is coupled to the gate terminal of the FET M3 and coupled through a filter to the input terminal (+) of the operational amplifier PBUF.

A filter circuit F11 is a circuit for suppressing noise generated from the operational amplifier BIAS.

The operational amplifier PBUF is an operational amplifier that functions as a buffer amplifier for outputting the same potential as the operational amplifier BIAS by comparing the output of the operational amplifier BIAS and the output of the operational amplifier PBUF. The output of the operational amplifier PBUF and an RF signal are added together and inputted to the gate terminal of an FET M4.

An RF terminal is coupled to the gate terminal of the FET M4 through a capacitor for eliminating a DC component. Therefore, the output of the operational amplifier PBUF and the AC component of the RF are added together and inputted to the gate terminal of the FET M4.

The FET M4 is an amplifier circuit which amplifies the AC component of the RF applied to the gate terminal of the FET M4 and outputs an output power Pout.

The current mirror circuit CM is a current replication circuit for feeding back the current of the drain terminal of the FET M3 to the input terminal of the operational amplifier BIAS. The current mirror circuit CM is configured with P-type FETs. In the current mirror circuit CM, the source terminals of the two FETs are coupled together. Further, the gate terminals of the two FETs are at the same potential.

The bias circuit shown in FIG. 3 is strongly affected by a voltage applied to the drain terminal of the FET configuring the current mirror circuit. Specifically, as an input voltage Vin decreases, the current flowing through the FET M3 decreases due to the drain modulation effect (the voltage transitions to a lower voltage in the graph of FIG. 2). As a result, the potential of the FET M1 also changes.

As the drain potential of the FET M3 changes, the flowing current changes due to the drain modulation effect of the FET M3. The current change of the FET M3 provides negative feedback to the drain/gate terminal of the FET M1 via the current mirror circuit CM, so that a current proportional to a current flowing through the FET M2 flows through the FET M3. Therefore, even if the input voltage Vin changes, a constant current flows through the FET M3 eventually.

The potential of one input terminal (+) of the operational amplifier PBUF is the potential of the gate terminal of the FET M3. The potential of the other input terminal (−) of the operational amplifier PBUF is the output of the operational amplifier PBUF. Therefore, the output potential of the operational amplifier PBUF is nearly equal to the potential of the gate terminal of the FET M3, so that the common potential is provided to the gate terminal of the FET M3 and the gate terminal of the FET M4.

A constant bias current also flows through the FET M4 to which the common DC potential with the FET M3 is provided. For lower power consumption, the input voltage Vin is applied to the drain of the FET M4 and reduced to reduce the output power Pout. At this time, the voltage applied to the current mirror circuit CM also decreases.

Figure 4:
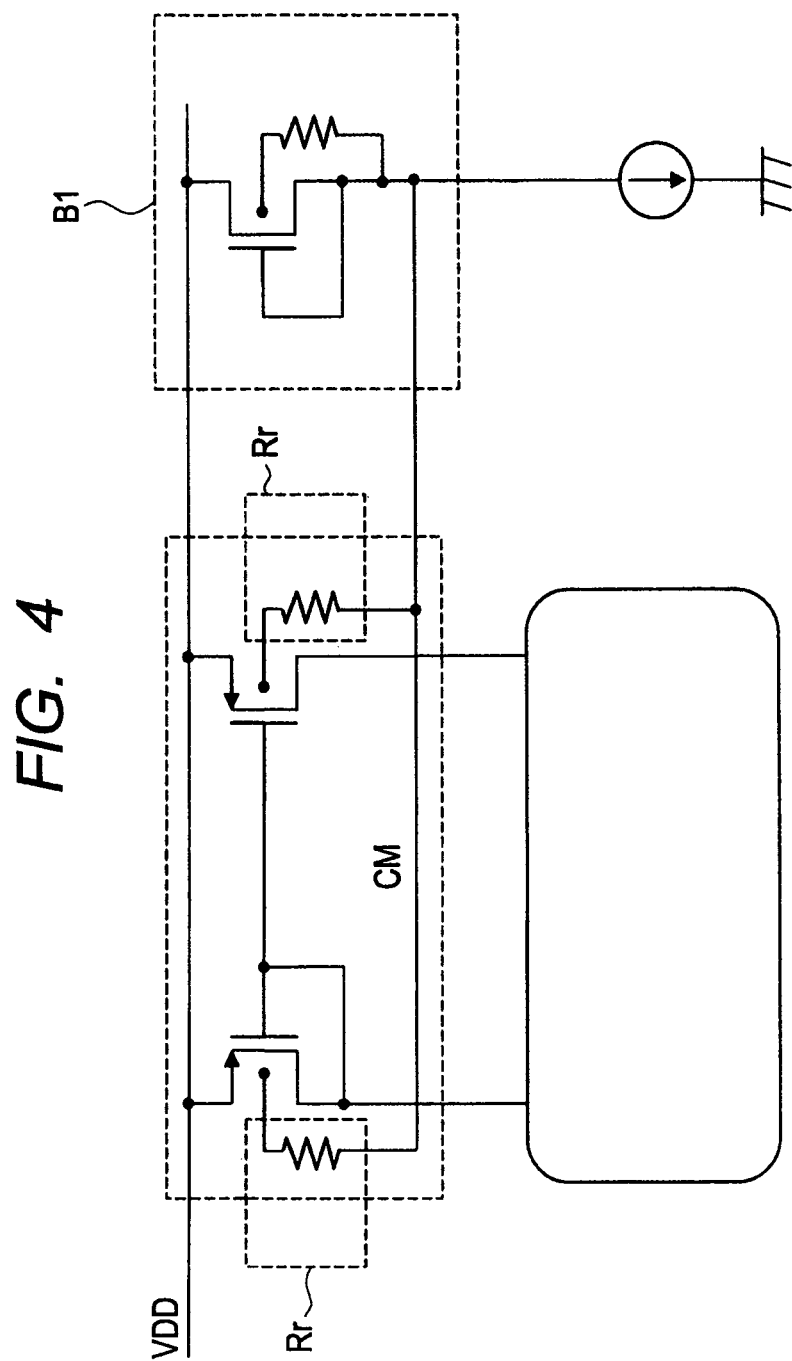
FIG. 4 is a circuit diagram of assistance in explaining the back-gate effect of the bias circuit according to the first embodiment.

FIG. 4 is a circuit diagram of assistance in explaining the back-gate effect of the bias circuit according to the first embodiment.

In FIG. 4, back-gate terminals are attached to the FETs configuring the current mirror circuit CM shown in FIG. 3. The invention is characterized in that the back-gate terminals of the FETs configuring the current mirror circuit are coupled to a drain terminal. In the invention, a back-gate potential is set through a resistor Rr. The resistor Rr is inserted to suppress a current flowing through the back-gate terminal of each FET.

In FIG. 4, a back-gate bias circuit B1 is a circuit for determining the back-gate voltage of each FET. The back-gate terminals of the FETs configuring the current mirror circuit CM are coupled through the resistors to the output terminal of the back-gate bias circuit B1. Further, the output of the back-gate bias circuit B1 is biased by an FET to which a constant bias potential is applied and which performs a constant-current operation.

Figure 21A:
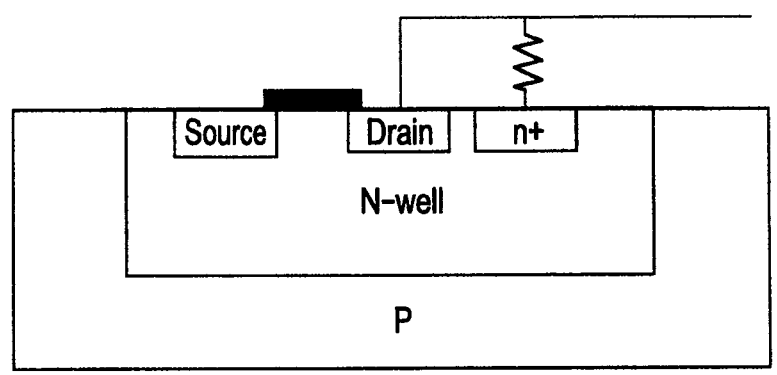
FIG. 21A is a sectional view of a P-type MOSFET.

FIG. 21A is a sectional view of a P-type FET used in the back-gate bias circuit B1.

When the current mirror circuit CM operates, the back-gate bias circuit B1 is energized as a diode. On the other hand, when the current mirror circuit CM does not operate, the back-gate bias circuit B1 is not energized. As a result, it is possible to prevent an increase in power consumption due to continuous energization to the back-gate terminals.

During conduction, the back-gate bias circuit B1 produces a voltage drop of about 0.6 V across the diode. A voltage obtained by subtracting the voltage drop from a power supply voltage is applied to the back gates of the FETs configuring each current mirror circuit.

The effect of the resistor Rr inserted into the back gate will be described with reference to FIGS. 5A, 5B and FIG. 21B.

Figure 5A:
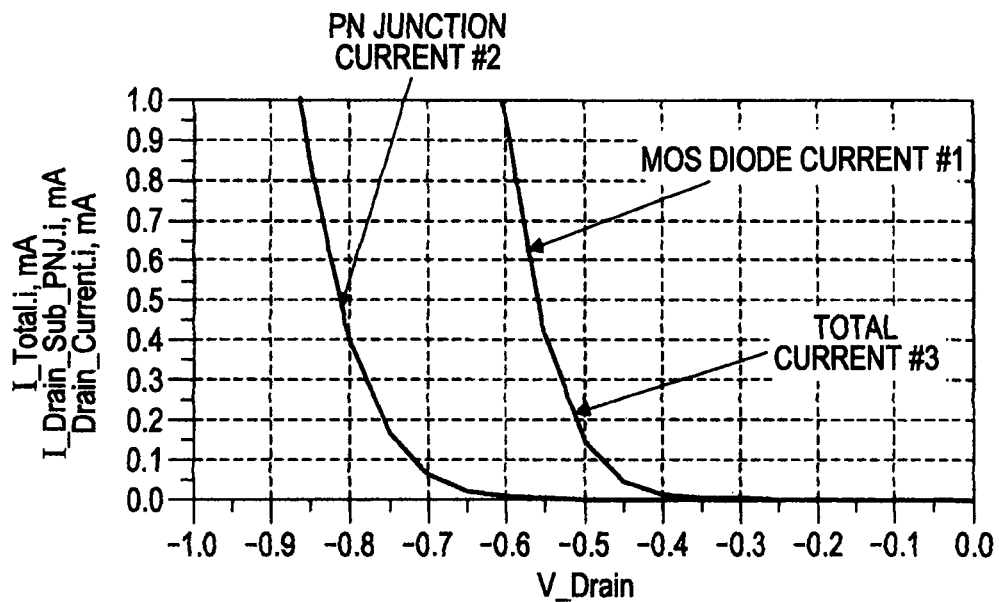
FIGS. 5A and 5B are graphs showing the effect of a resistor coupled between the back-gate terminal of an FET and the drain terminal.
Figure 5B:
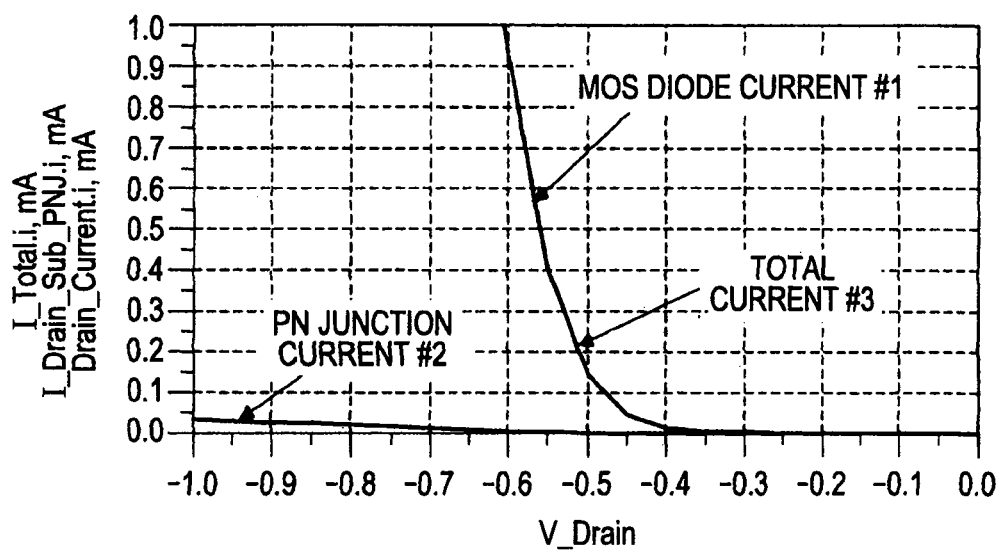

FIGS. 5A and 5B are graphs showing the effect of the resistor coupled between the back-gate terminal of the FET and the drain terminal. FIG. 5A is a graph in the absence of the resistor Rr, and FIG. 5B is a graph in the presence of a 5-kΩ resistor Rr inserted between the back-gate terminal and the drain terminal. In the graphs, the vertical axis represents a total current (#3) flowing through the back-gate bias circuit B1, a current (#2) flowing from the back-gate terminal, and a current (#1) flowing through the diode-coupled FET. Further, the horizontal axis represents a drain terminal potential with respect to a source terminal potential assumed to be 0V.

Figure 21B:
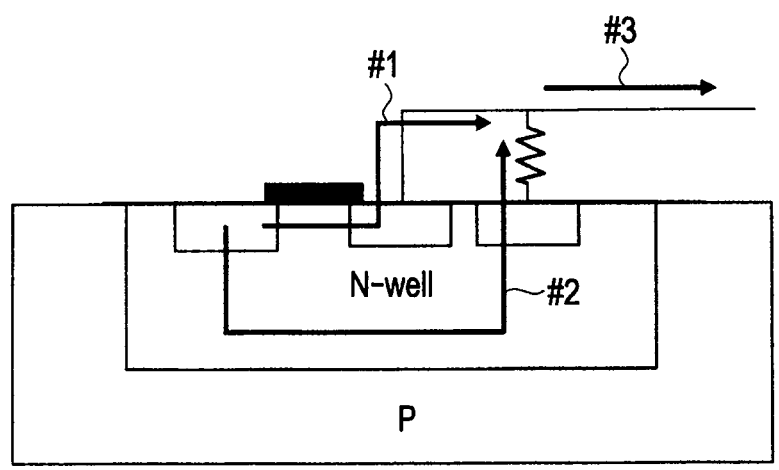
FIG. 21B is a conceptual illustration for specifying currents flowing through the MOSFET.

FIG. 21B is a conceptual illustration showing the measurement points of the currents flowing through the FET in the graphs of FIGS. 5A and 5B. In FIG. 21B, reference numerals #1, #2, and #3 represent the measurement points of the currents in the graphs of FIGS. 5A and 5B.

In the absence of the resistor, the current increases as the potential difference between the back-gate and drain terminals increases (FIG. 5A). However, by inserting the 5-kΩ resistor Rr, it is possible to minimize the current. Therefore, it is possible to reduce the power consumption of each FET of back-gate-coupling.

In the coupling configuration of biasing the back-gate terminal, it is possible to reduce the threshold voltage Vth of each FET. FIGS. 6A and 6B and FIGS. 7A and 7B are graphs for comparison of the threshold voltages Vth of FETs.

Figure 6A:
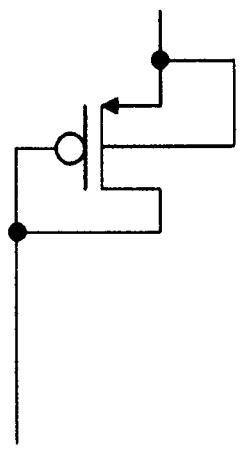
FIGS. 6A and 6B are graphs showing the change of a threshold voltage Vth in the case where the back-gate terminal is coupled to an input voltage Vin.
Figure 6B:
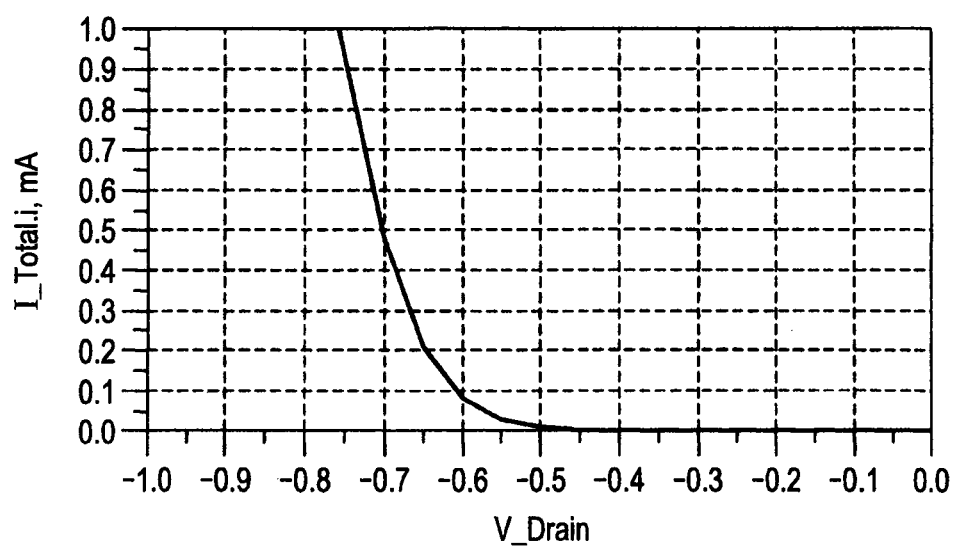
Figure 7A:
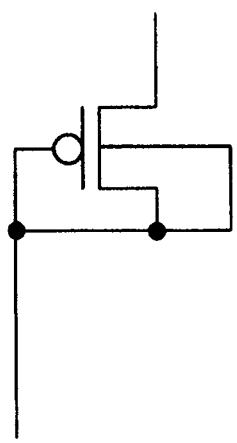
FIGS. 7A and 7B are graphs showing the change of the threshold voltage Vth in the case where the back-gate terminal is grounded.
Figure 7B:
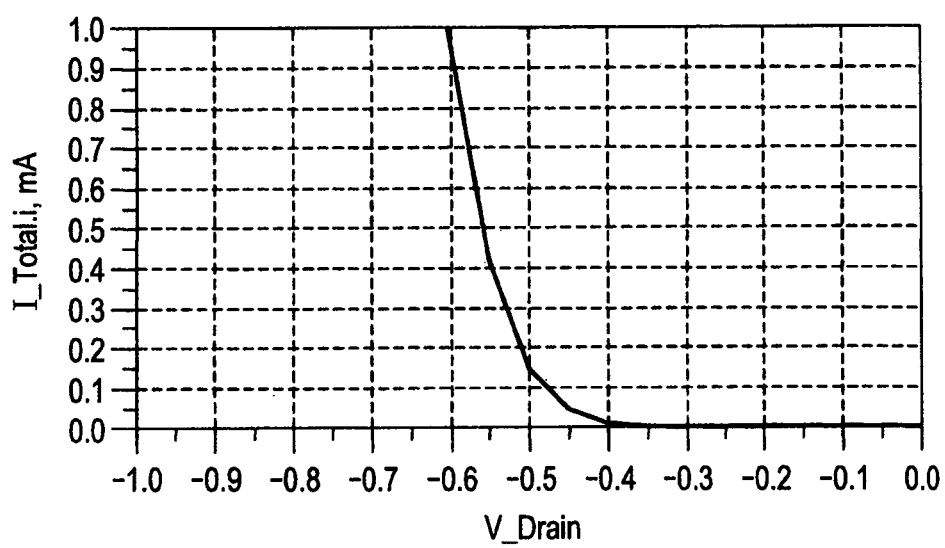

FIGS. 6A and 6B are graphs showing the change of the threshold voltage Vth in the case where the back-gate terminal is coupled to the input voltage Vin. FIGS. 7A and 7B are graphs showing the change of the threshold voltage Vth in the case where the back-gate terminal is biased to the drain potential. FIGS. 6A and 7A show the circuit configurations, and FIGS. 6B and 7B show the threshold voltage change.

As shown in FIG. 6B, in the case where the back-gate terminal is coupled to the input voltage Vin, the threshold voltage Vth is 0.62 V at a current of 100 µA. On the other hand, in the case where the back-gate terminal is grounded in FIG. 7B, the threshold voltage Vth is 0.47 V at a current of 100 µA.

Thus, the back-gate terminal is biased to the drain potential to reduce the threshold voltage Vth, and the resistor is inserted between the back-gate terminal and the drain terminal to suppress the current, thereby reducing the power consumption and increasing the low-voltage operation margin of the feedback circuit.

Next, description will be made on a bias circuit obtained by combining the element techniques described above.

Figure 8:
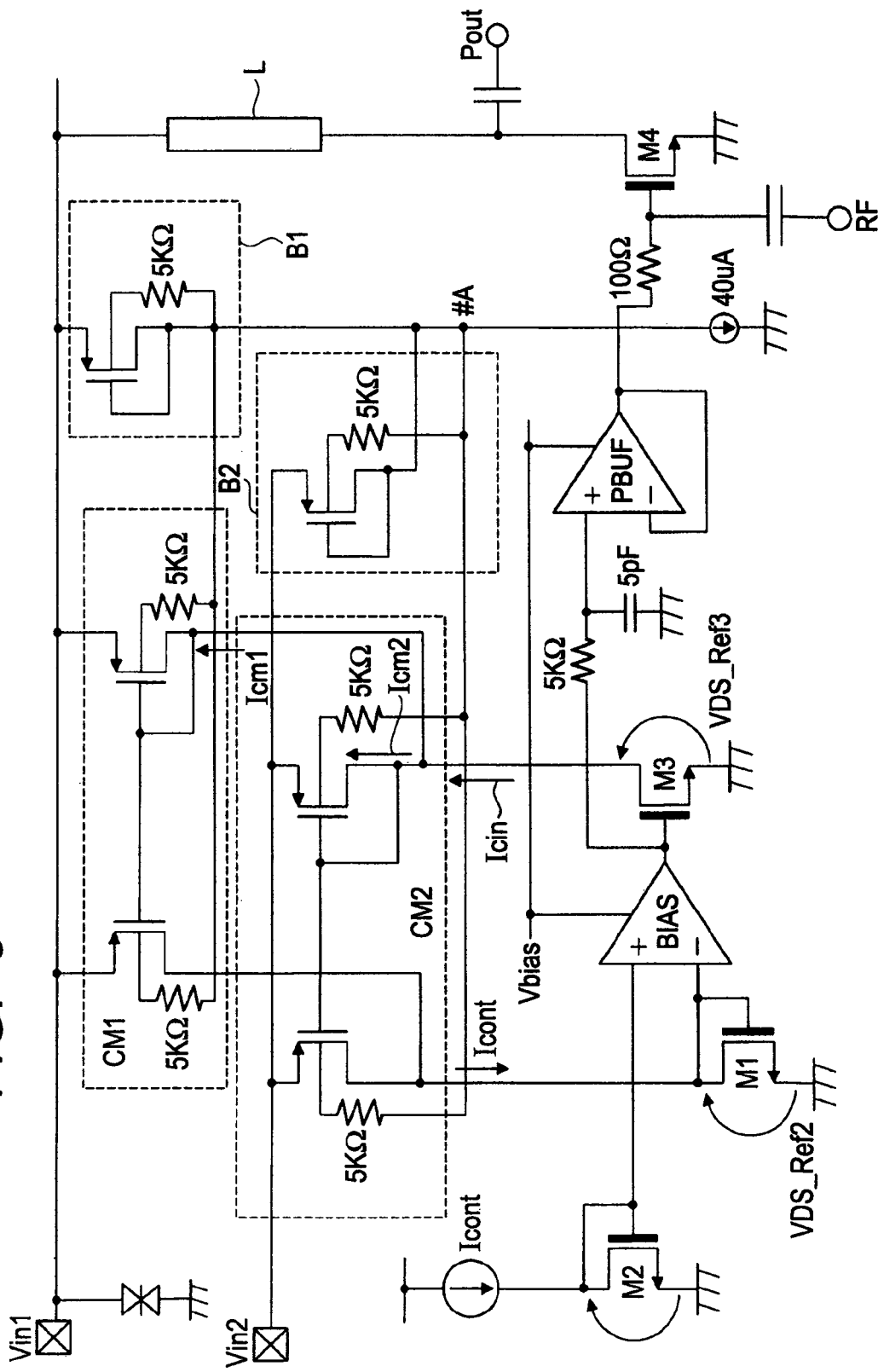
FIG. 8 is a circuit diagram showing the configuration of the bias circuit according to the first embodiment.

FIG. 8 is a circuit diagram showing the configuration of the bias circuit according to this embodiment.

This bias circuit is characterized in that it has two current mirror circuits CM1 and CM2 corresponding to two input voltages Vin1 and Vin2.

Assume that the input voltage Vin1 is a variable voltage ranging from 5.1 to 0.5 V. This enables operation with necessary and sufficient power consumption by increasing and decreasing the input voltage Vin1 applied for the power of the amplifier circuit in accordance with increase and decrease in the output power to reduce the power consumption. These values are supposed to be used in a later-described bias circuit for both W-CDMA and GSM. As a matter of course, the input voltage other than these values may be adopted, depending on the application.

In this embodiment, the input voltage Vin1 is also applied to the drain terminal of the FET M4 for RF amplification. With this, it is possible to adjust the output power of the FET M4 by changing the input voltage Vin1. The input voltage Vin1 is supplied from a DC-DC converter 101 (not shown in FIG. 8, but shown in FIG. 14).

Thus, as the output power of the FET M4 is decreased, the voltage supplied to the current mirror circuit CM1 is decreased. Further, as the output power Pout of the FET M4 is increased, the voltage supplied to the current mirror circuit CM1 is increased.

On the other hand, the input voltage Vin2 is a fixed voltage of 2.7 V. In this embodiment, the input voltage Vin2 is equal to the voltage Vbias for the operational amplifier bias circuit. This is because this value is used in the later-described bias circuit for both W-CDMA and GSM. However, a different constant voltage may be used as the input voltage Vin2.

The current mirror circuit CM1 is a current mirror circuit whose power supply voltage is the input voltage Vin1, and the current mirror circuit CM2 is a current mirror circuit whose power supply voltage is the input voltage Vin2. The input terminals of the current mirror circuits CM1 and CM2 are coupled to the drain terminal of the FET M3. On the other hand, the output terminals of the current mirror circuits are coupled to the drain terminal of the FET M1.

Assume that Icin denotes a current flowing into the two current mirror circuits, Icm1 denotes a current flowing into the current mirror circuit CM1, Icm2 denotes a current flowing into the current mirror circuit CM2, and Icout denotes a current flowing from the two current mirror circuits. According to Kirchhoff's law and the property of current replication by the current mirror circuit, the following relation is obtained.

$$Icin = Icm1 + Icm2 = Icout \quad (7)$$

That is, Icin is equal to Icout whether the current flowing into the current mirror circuit CM1 or CM2 increases or decreases.

Icin, that is, the drain current of the FET M3 is replicated by the current mirror circuits CM1 and CM2 and applied to the FET M1. Feedback is provided so that the gate voltage of the FET M1 becomes equal to the gate voltage of the FET M2.

The effect of the two input voltages Vin1 and Vin2 will now be described.

The back-gate terminals of the two current mirror circuits are coupled together through the drain terminals of the respective back-gate bias circuits B1 and B2 (#A in FIG. 8). As described above, the input voltage Vin2 is fixed to 2.7 V. Therefore, at #A in FIG. 8, at least a voltage of about 2.1 V (=input voltage Vin2−diode voltage drop (0.6 V)) is applied to the back-gate terminals of the current mirror circuits.

Figure 9:
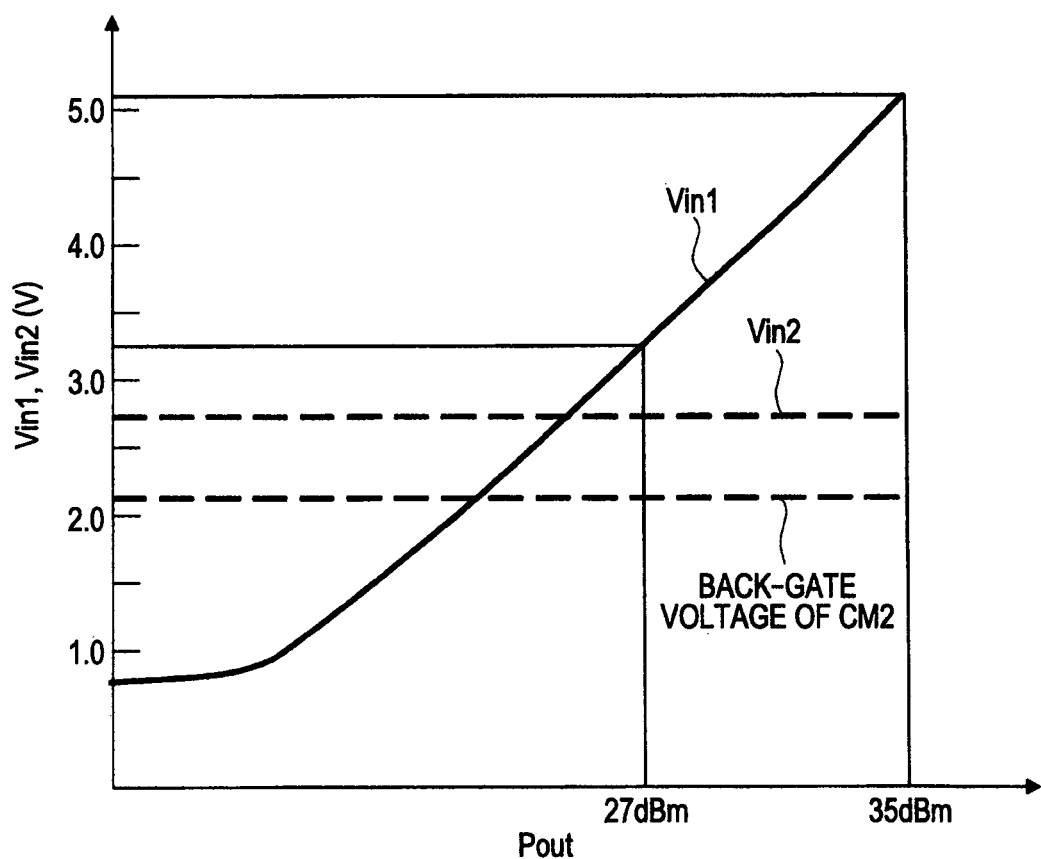
FIG. 9 is a graph showing the relation between the input voltages Vin1 and Vin2.

FIG. 9 is a graph showing the relation between the input voltages Vin1 and Vin2. In the graph, the vertical axis represents the input voltages Vin1 and Vin2 (V), and the horizontal axis represents the output (dBm) of the amplifier circuit.

The input voltage Vin1 is directly proportional to the output of the amplifier circuit while the input voltage Vin1 is relatively high, that is, the assumed output power Pout is high.

As described above, the power supply voltage of the amplifier circuit is equal to the input voltage Vin1. With this, for example, in the case of the application of W-CDMA, the output voltage may be decreased to about 0.5 V to reduce the power consumption. When the input voltage Vin1 decreases to about 0.7 V, the operation of the current mirror circuit CM1 becomes unstable, so that the feedback to the FET M1 in FIG. 3 does not operate.

On the other hand, the parallelly-provided current mirror circuit CM2 operates at 2.7 V. Although the input voltage Vin1 decreases close to the threshold voltage Vth of the FETs configuring the current mirror circuit CM1, the current mirror circuit CM2 which has no voltage variation operates with stability. This enables continuation of the operation, with changes in the loads of the current mirror circuits CM1 and CM2. As a result, it is possible to feed back the current of the FET M3 with reliability.

Further, it can be seen that the input voltage Vin1 is directly proportional to the output if it is higher than a potential (2.1 V) coupled to the back gates of the FETs configuring the current mirror circuits in the output adjustment of the bias circuit. With this, it is possible to adjust the output.

Thus, the current flowing through the back-gate of the FET is suppressed by the resistor, the threshold voltage is reduced by coupling the back-gate to the drain side, not to the power supply side, and the current mirror circuit that operates at the fixed input voltage and the current mirror circuit that operates at the variable input voltage are provided parallelly, thereby enabling the low-voltage operation of the feedback circuit with reliability.

Second Embodiment

Next, a second embodiment of the invention will be described.

In the first embodiment, the output adjustment by changing the input voltage Vin1 has been described. In this embodiment, output adjustment through the use of a variable current source instead of the constant current source Icont will be described.

Figure 10:
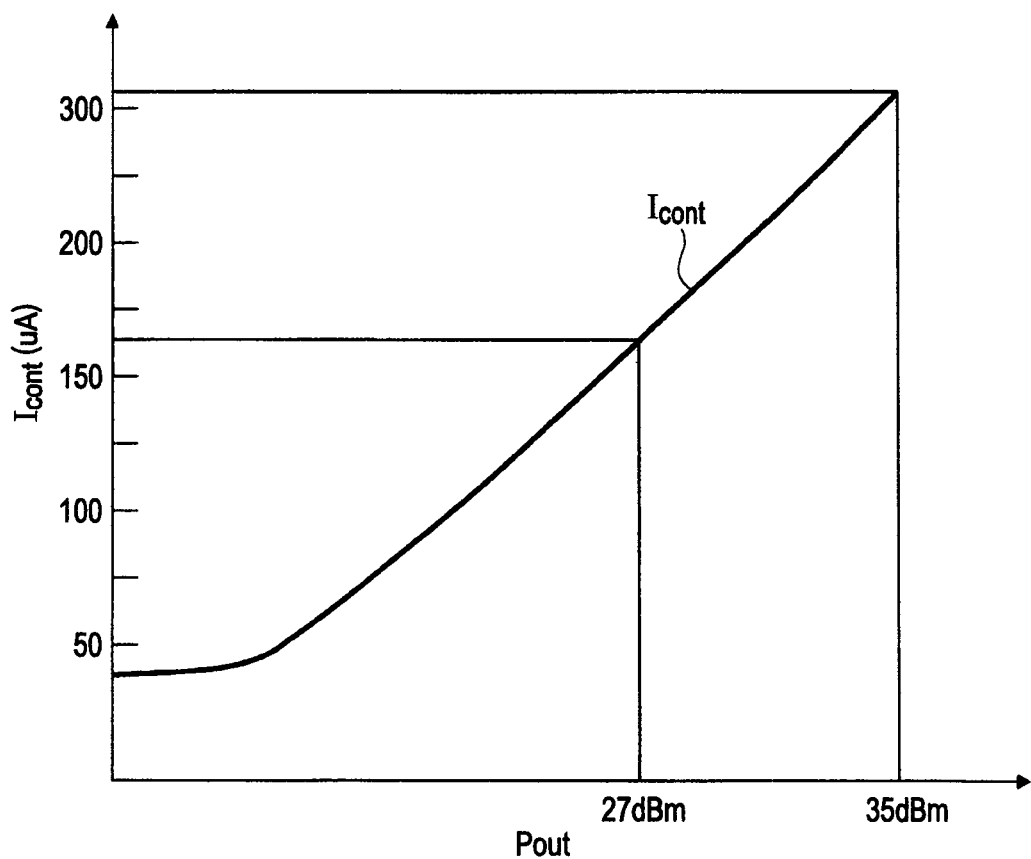
FIG. 10 is a graph showing the output change of the bias circuit through the use of a variable current source instead of a constant current source Icont.

FIG. 10 is a graph showing the output change of the bias circuit through the use of a variable current source instead of the constant current source Icont (see FIGS. 3 and 8).

As shown in this graph, by changing the current inputted to the operational amplifier BIAS through the FET M2, it is possible to decrease the output from 35 to 27 dBm. With such a property, it is possible to adjust the output even if the input voltage Vin1 cannot be changed. Particularly in this embodiment, an output power in W-CDMA operation requires a wide dynamic range. In the case of a dynamic range of about 74 dB, the minimum output power reaches as low as −47 dBm. In such a case, it is effective to use this embodiment.

Third Embodiment

Next, a third embodiment will be described.

This embodiment is characterized in that, to cancel the error of leaks to the back gates of the FETs configuring the current mirror circuits, leak currents are added to a reference current (Icont) to offset the error.

Figure 11:
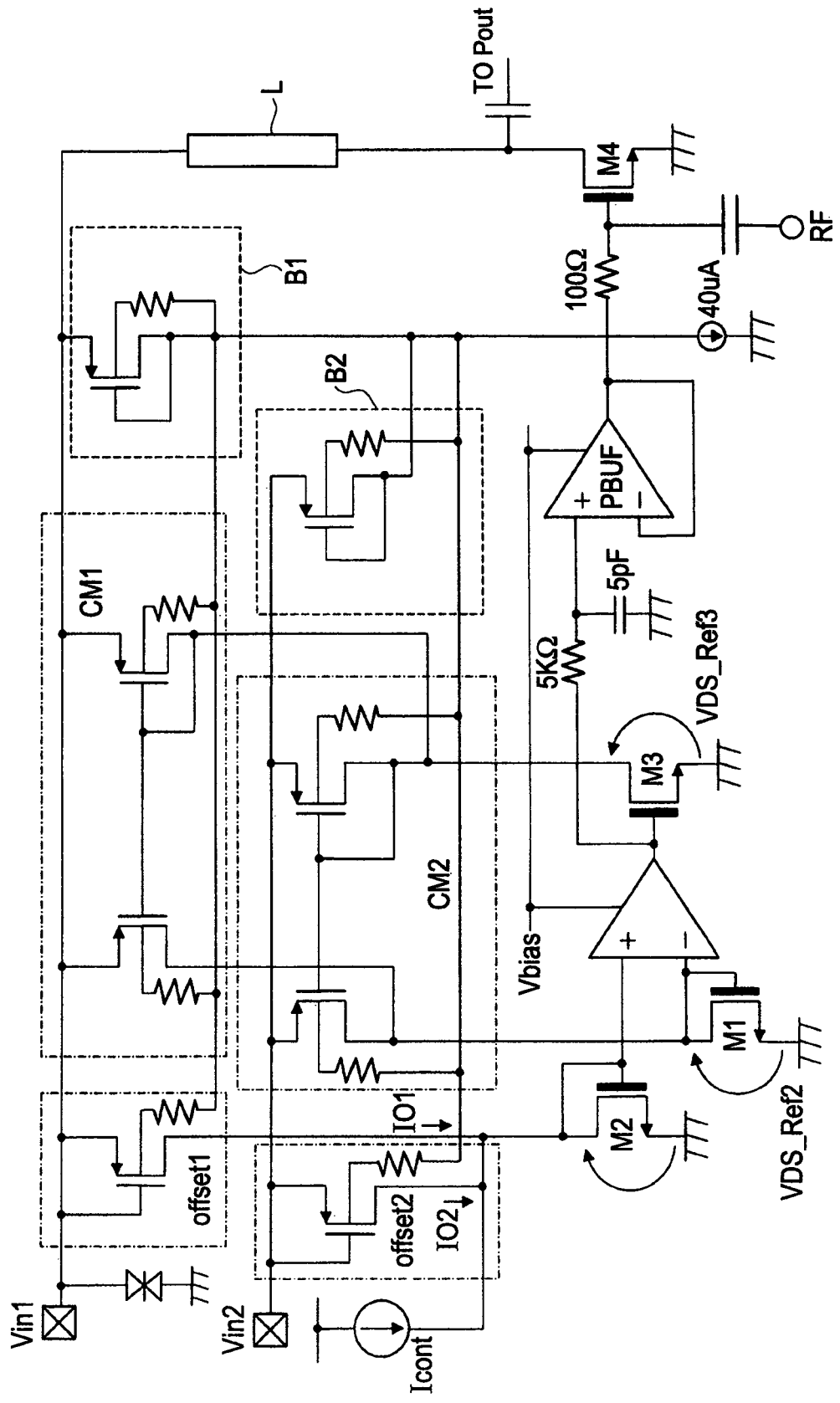
FIG. 11 is a circuit diagram showing the configuration of a bias circuit according to a third embodiment of the invention.

FIG. 11 is a circuit diagram showing the configuration of a bias circuit according to the third embodiment of the invention.

This bias circuit is characterized in that offset circuits Offset1 and Offset2 are inserted between the coupling point (#A in FIG. 8) of the back-gate terminals of the current mirror circuits CM1 and CM2 and the input voltages Vin1 and Vin2 respectively.

The offset circuits Offset1 and Offset2 outputs leak currents occurring at the back-gate terminals of the corresponding current mirror circuits CM1 and CM2. From the offset circuits Offset1 and Offset2, leak currents 101 and 102 are outputted and detected.

The detected leak currents 101 and 102 are coupled to the output of the constant current source Icont. Therefore, the leak currents are added to the reference current outputted by the constant current source Icont.

This makes it possible to provide a common reference voltage generation path.

Figure 12:
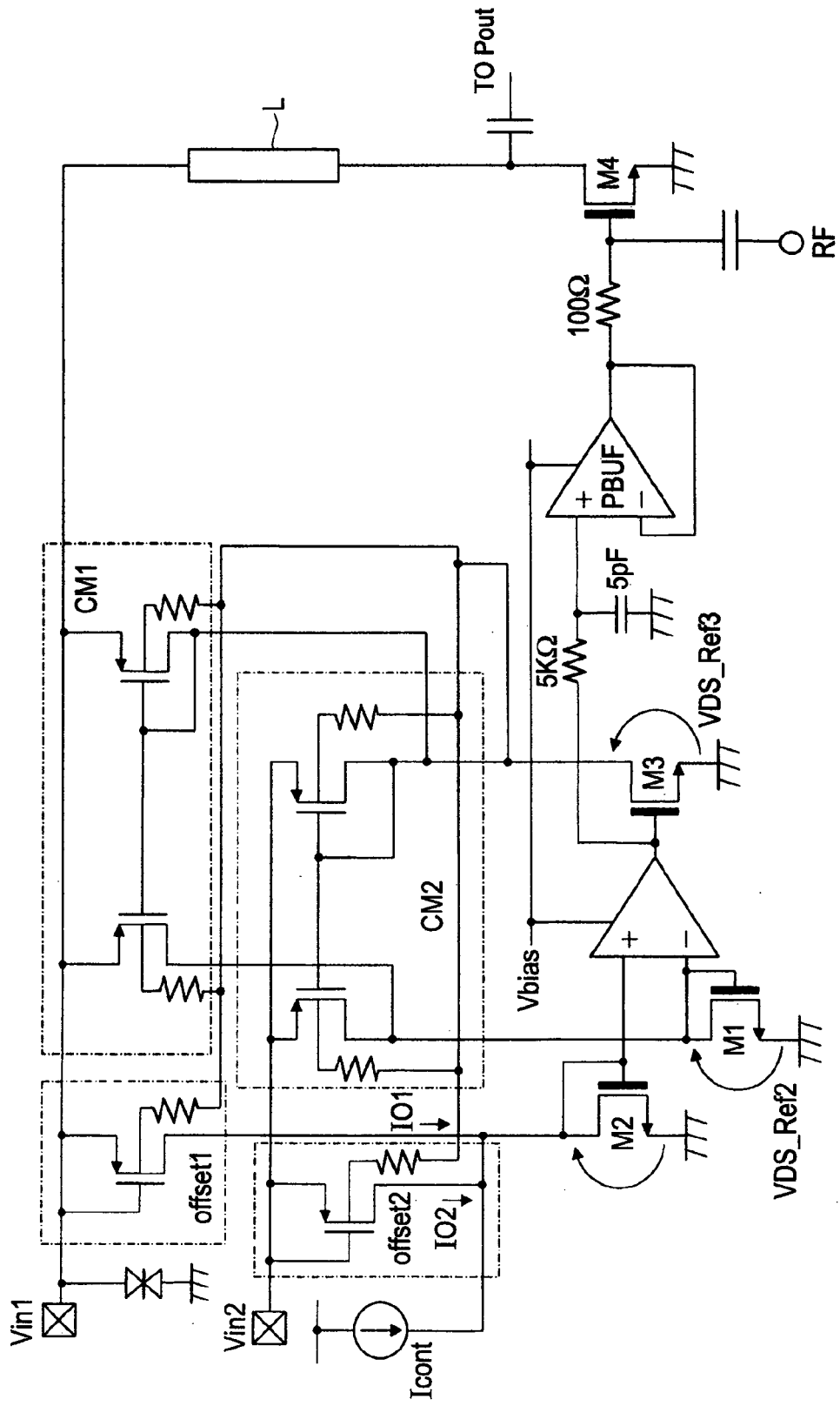
FIG. 12 is a circuit diagram showing the configuration of another bias circuit according to the third embodiment of the invention.
Figure 13:
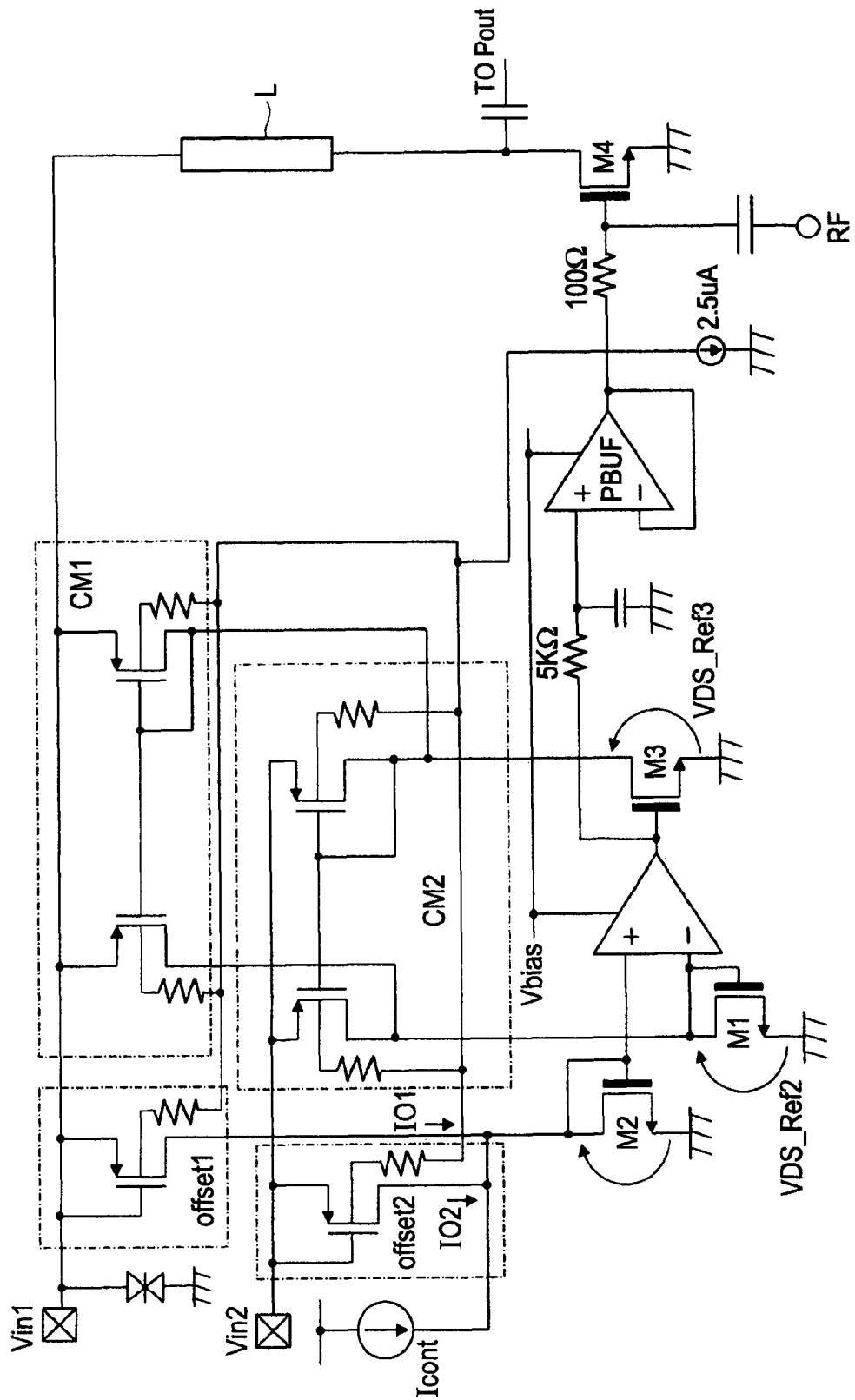
FIG. 13 is a circuit diagram showing the configuration of yet another bias circuit according to the third embodiment of the invention.

FIG. 12 is a circuit diagram showing the configuration of another bias circuit according to the third embodiment of the invention. FIG. 13 is a circuit diagram showing the configuration of yet another bias circuit according to the third embodiment of the invention.

In the configuration shown in FIG. 12, the leak currents of the back-gate terminals are added to the drain current of the FET M3. Further, in FIG. 13, the leak currents are pulled out by a common constant current source.

Figure 1:
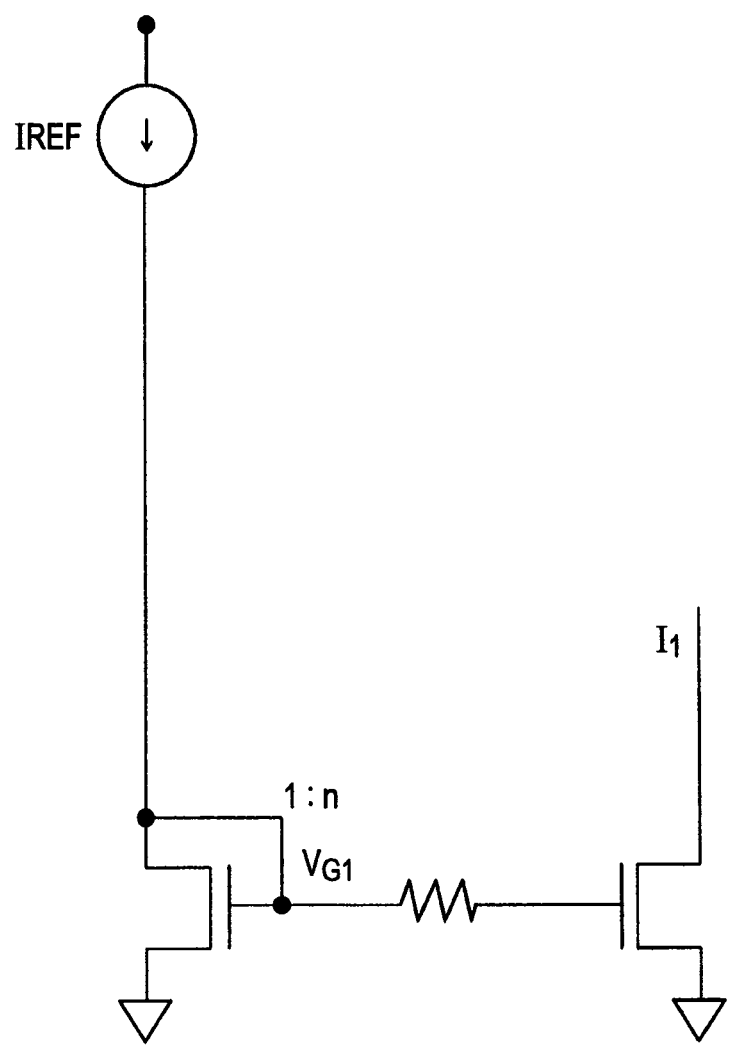
FIG. 1 is a circuit diagram showing the configuration of a typical current mirror circuit.
Figure 2:
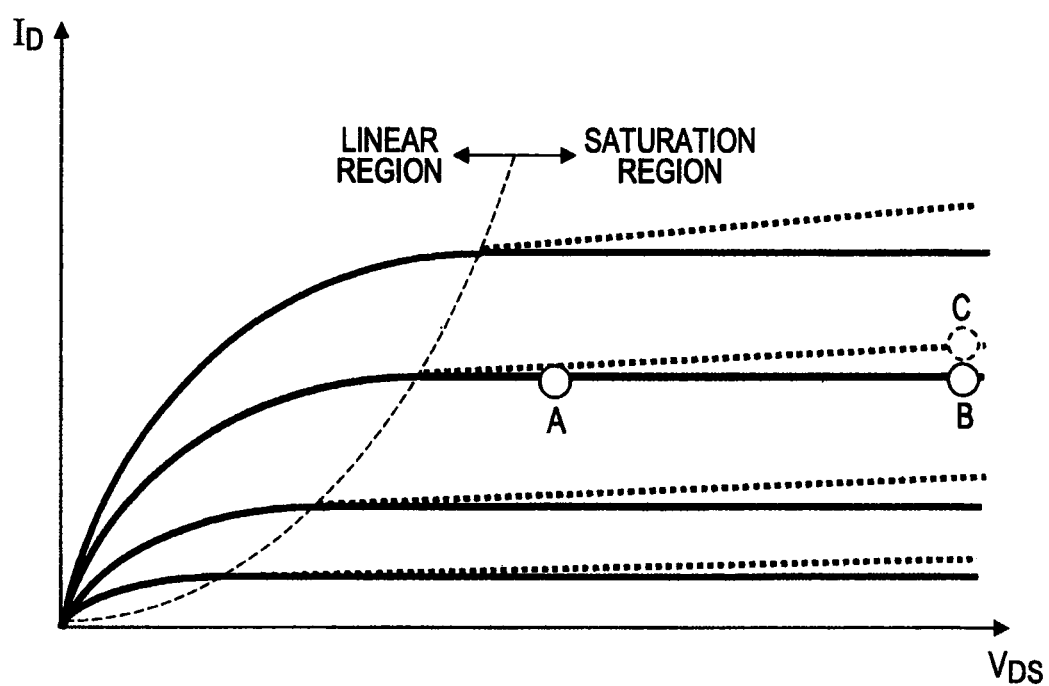
FIG. 2 is a graph showing the drain modulation effect of an FET.

Besides these circuit configurations, by detecting offset currents to minimize the error, it is possible to approach the ideal values shown in FIG. 2.

Fourth Embodiment

Next, a fourth embodiment will be described with reference to the drawings.

In this embodiment, a multiband bias circuit is configured with circuits according to the first to third embodiments.

Figure 14:
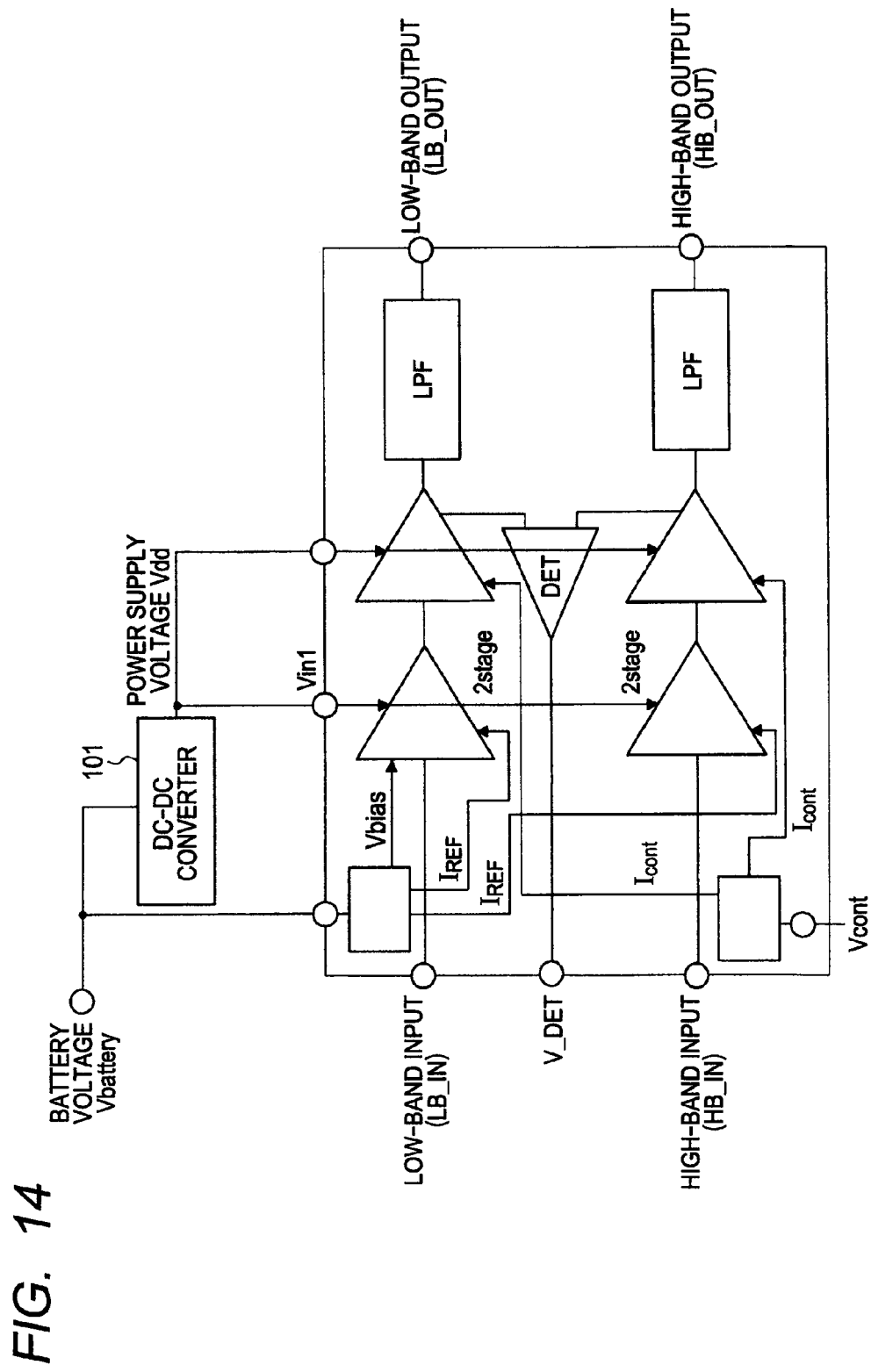
FIG. 14 is a block diagram of a multiband bias circuit configured with bias circuits according to the first to third embodiments.

FIG. 14 is a block diagram of the multiband bias circuit configured with bias circuits according to the first to third embodiments.

This bias circuit has two-line amplifiers which are a low-band amplifier for amplifying a frequency band in the vicinity of 1 GHz (800 MHz, 900 MHz, etc.) and a high-band amplifier for amplifying a frequency band in the vicinity of 2 GHz (1.9 GHz, 2 GHz, 2.1 GHz, etc.).

The two-line amplifiers can support two systems which are the GSM system (380 MHz to 1.9 GHz) and the W-CDMA system (850 MHz to 2.1 GHz) by changing a power supply voltage Vdd.

In the invention, two-line power supply voltages are required. Vin1 inputted from a DC-DC converter 101 corresponds to Vin1 in FIG. 8. Further, Vbias in FIG. 14 is inputted to Vbias and Vin2 in FIG. 8.

The current value of the constant current source Icont is determined by the bias circuit.

Figure 22:
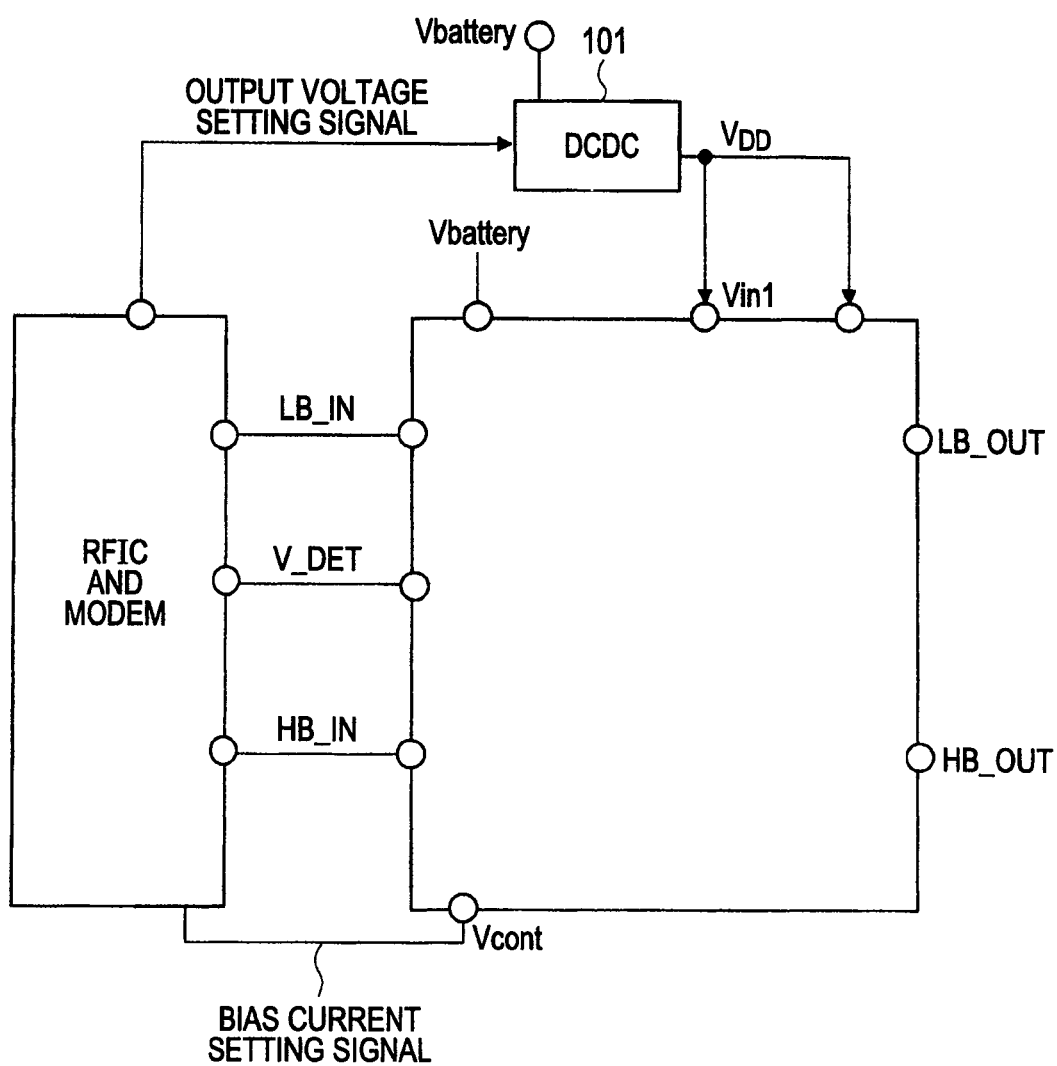
FIG. 22 is a diagram showing the configuration of peripherals for a power amplifier configured with bias circuits according to the first to third embodiments.

FIG. 22 is a diagram showing the configuration of peripherals for a power amplifier. An RFIC, modem, and the like generates Vcont and a control signal for $V_{DD}$ so as to operate the power amplifier at minimum power supply voltage and bias current in accordance with the output level of the power amplifier.

First, output values required in the GSM and W-CDMA systems will be described.

Figure 15:
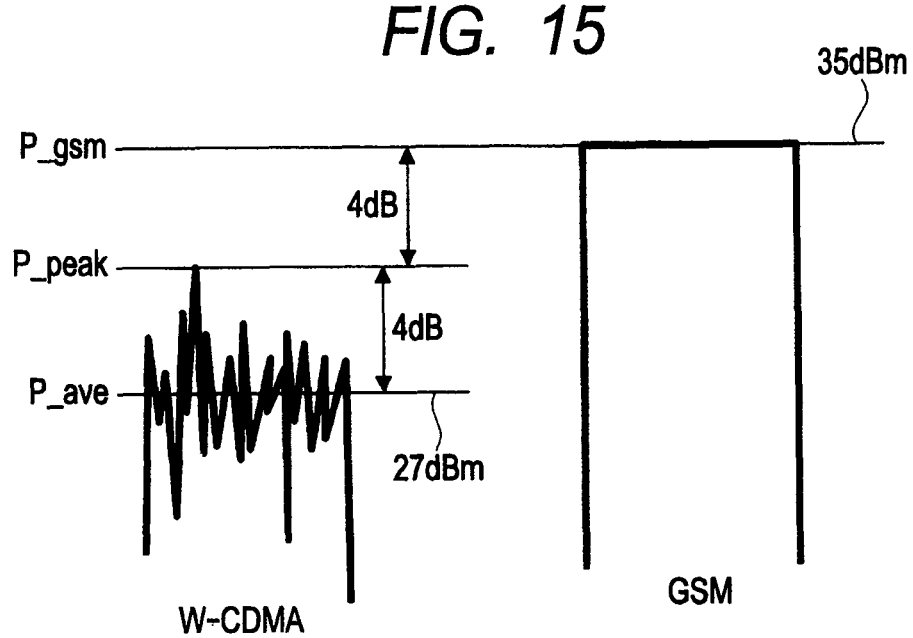
FIG. 15 is a conceptual illustration showing an output waveform required for a low-band amplifier.
Figure 16:
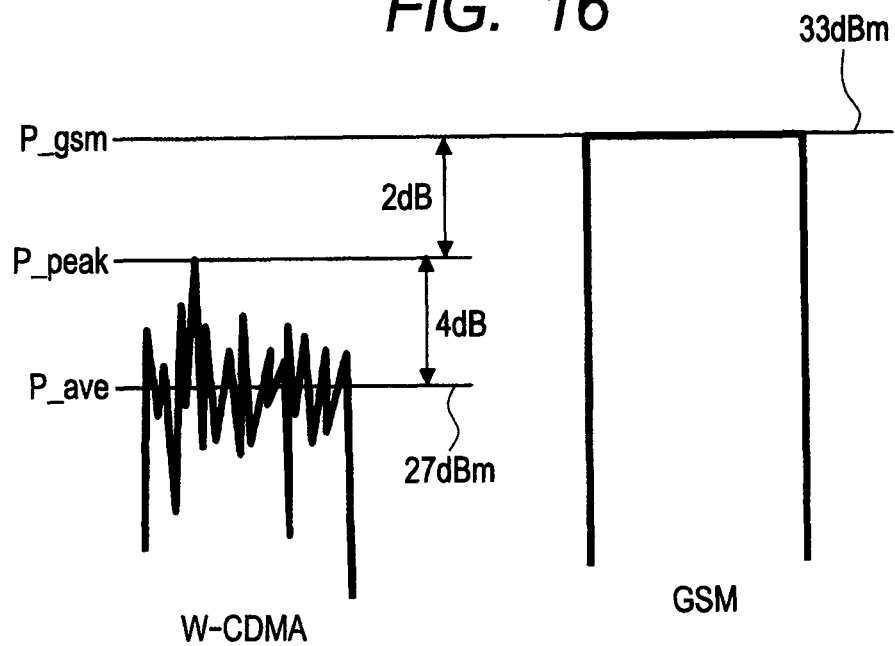
FIG. 16 is a conceptual illustration showing an output waveform required for a high-band amplifier.

FIG. 15 is a conceptual illustration showing an output waveform required for the low-band amplifier. FIG. 16 is a conceptual illustration showing an output waveform required for the high-band amplifier.

In GSM, an output of 35 dBm is required in the low band, and an output of 33 dBm is required in the high band. On the other hand, in W-CDMA of band spreading, a peak output of 31 dBm and an average output of 27 dBm are required, whether in the low band or in the high band. Thus, there exists an output difference of 8 dB.

There exists a saturation power difference of 4 dB between the GSM system which adopts the GMSK modulation of constant amplitude modulation and the W-CDMA system which adopts the HQPSK modulation having a power difference of about 4 dB between the average and the peak. Even in the high band only, there is a saturation power difference of 2 dB.

As a countermeasure thereagainst, changes in the power supply voltage in accordance with load lines are effective.

Figure 17:
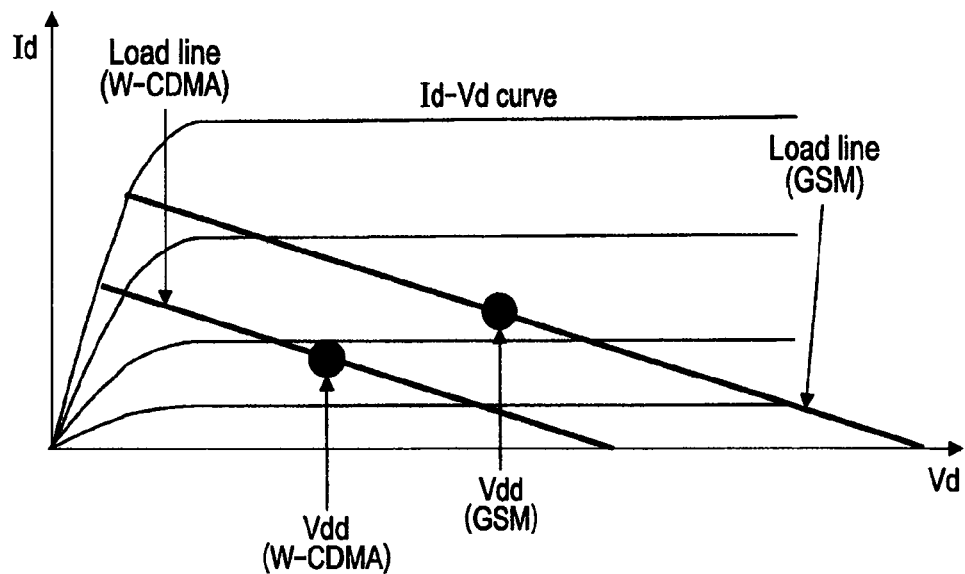
FIG. 17 is a graph showing the correspondence between the drain-source voltage Vd of an FET M4 and the drain current Id.

FIG. 17 is a graph showing the correspondence between the drain-source voltage Vd of the FET M4 in FIG. 8 and the drain current Id. In this graph, curves are drawn for the respective gate-source voltages (Vgs). By drawing load lines corresponding to specifications required for the systems, it is possible to define voltages to be set.

TABLE 1

|  | GSM/8PSK | WCDMA |
| --- | --- | --- |
| LOW BAND | 5.1 V | 3.3 V |
| HIGH BAND | 4.2 V | 3.3 V |

Table 1 is a table for voltage setting for the low band and the high band according to the invention. In the invention, the input voltage Vin1 is set as shown in this table in accordance with the transmission system and the amplifier to be used.

A reason for needing the DC-DC converter 101 (see FIG. 14) at the time of generating the required input voltage Vin1 will be described.

Figure 18:
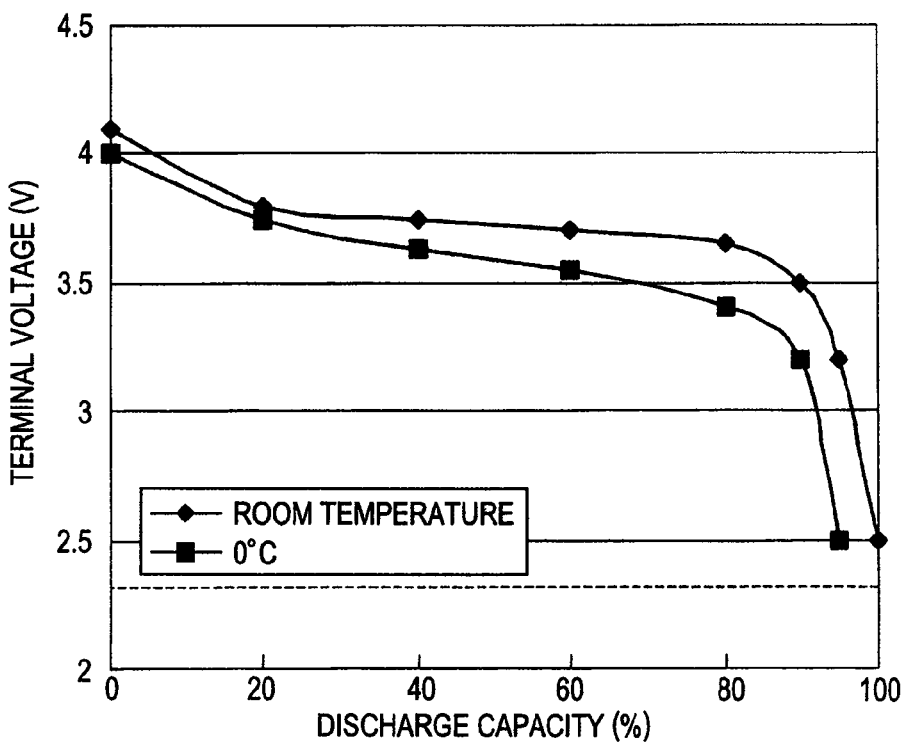
FIG. 18 is a graph showing the relation between the discharge capacity and terminal voltage of a lithium-ion battery which is currently widespread.

FIG. 18 is a graph showing the relation between the discharge capacity and terminal voltage of a lithium-ion battery which is currently widespread. As is obvious from this graph, the lithium-ion battery operates in a voltage range of about 3.5 to 4.0 V. This is not suitable for use in GSM shown in Table 1. Therefore, it is necessary to insert the DC-DC converter 101 in the real circuit.

Fifth Embodiment

Next, a fifth embodiment of the invention will be described with reference to the drawings.

In this embodiment, bias circuits described above are used to control a power amplifier having a two-stage cascade-coupling configuration.

Figure 19:
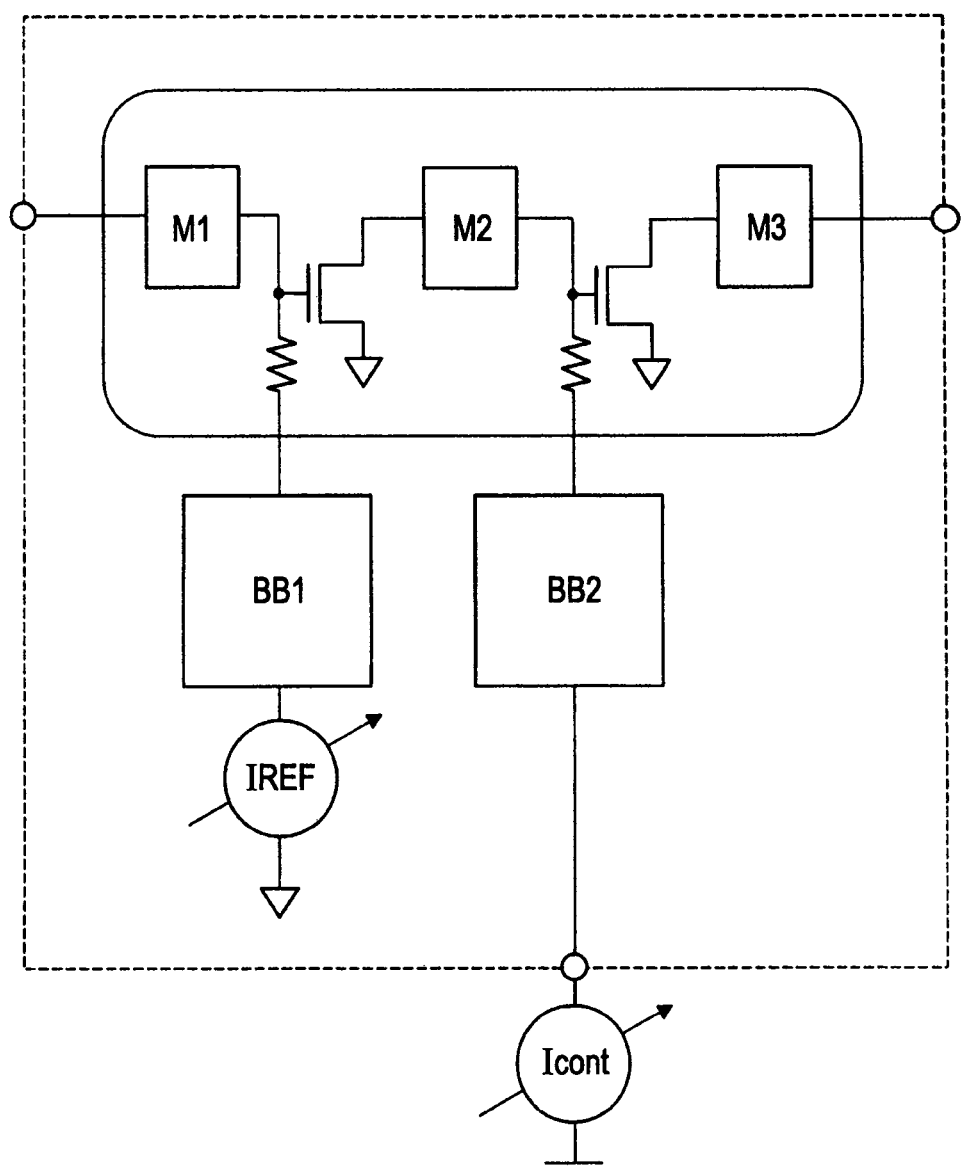
FIG. 19 is a block diagram showing the configuration of a power amplifier according to a fifth embodiment of the invention.
Figure 20:
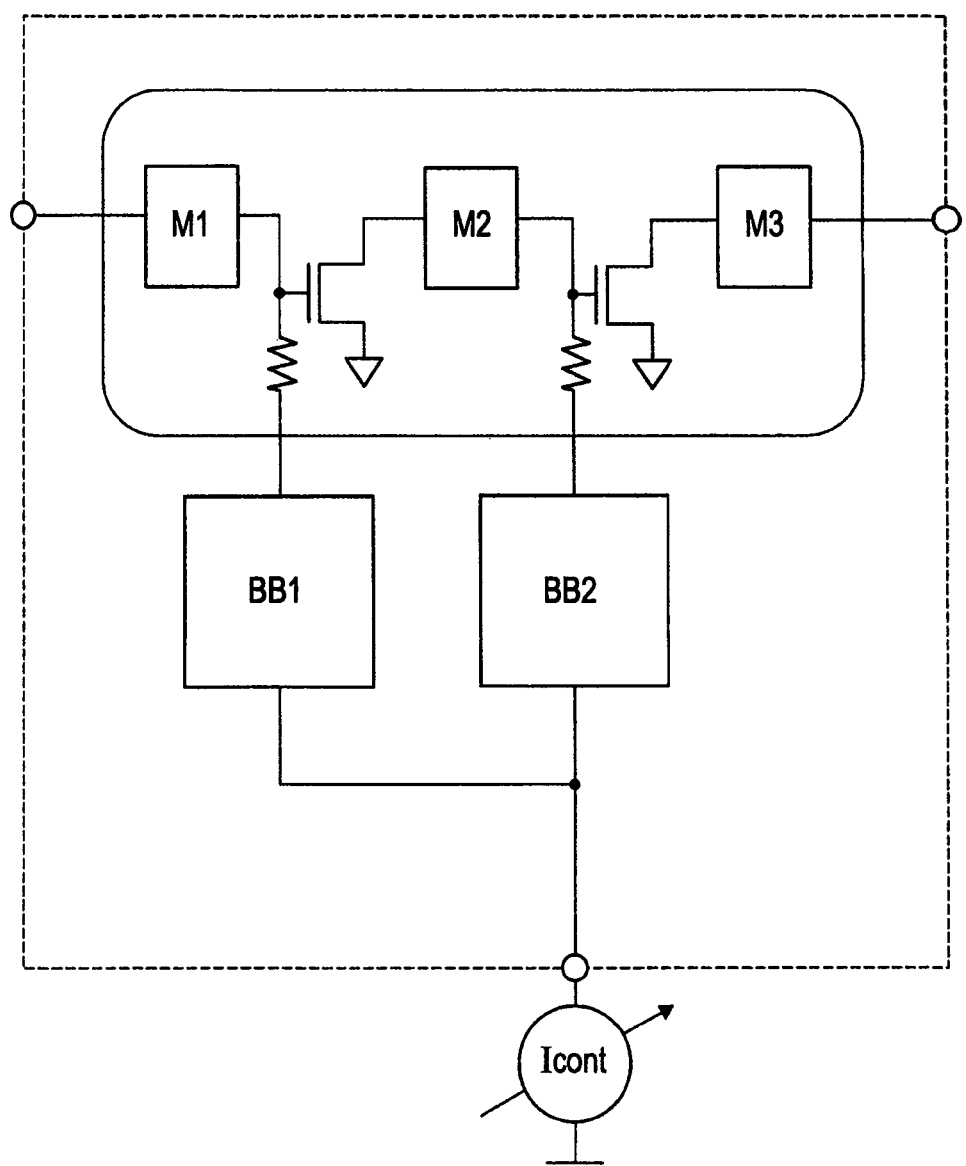
FIG. 20 is a block diagram showing the configuration of another power amplifier according to the fifth embodiment of the invention.

FIG. 19 is a block diagram showing the configuration of a power amplifier according to the fifth embodiment of the invention. FIG. 20 is a block diagram showing the configuration of another power amplifier according to the fifth embodiment of the invention.

These power amplifiers are configured with amplifiers M1, M2, and M3 and bias circuits BB1 and BB2. The bias circuits according to the invention described heretofore in this specification are adopted as the bias circuits BB1 and BB2.

In FIG. 19, the bias circuits BB1 and BB2 are controlled by independent current sources IREF and Icont. In FIG. 20, the bias circuits BB1 and BB2 are controlled by a common current source Icont.

In each power amplifier, a gain is determined by the transconductance (current-voltage conversion gain) of each stage and the impedance of a matching circuit.

Thus, the control current sources are separated or commonalized, thereby enabling detailed bias control including circuit implementation size or the temperature characteristic of each stage.

The description has been made on the application of the invention to the power amplifier in a cellular phone unit that supports multiple bands and the bias circuit used therein. However, the invention is applicable not only to the cellular phone unit but also to other information terminals such as PCs.

Further, the bias circuit according to the invention is applicable not only to the unit that supports the multiple bands of around 1 GHz and around 2 GHz but also to a unit that supports three or more frequencies such as 800 MHz, 1.7 GHz, and 2 GHz.

Furthermore, the bias circuit according to the invention may also be applied to an electronic device that uses two or more high frequencies, for example, a display unit such as PDP.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A bias circuit comprising:
an operational amplifier;
an FET which operates with an output of the operational amplifier inputted to a gate terminal of the FET; and
a current mirror circuit for feeding back a current flowing through a drain terminal of the FET to the operational amplifier,
wherein an output current of the current mirror circuit is inputted to one input terminal of the operational amplifier, and an output current of a current source is inputted to the other input terminal, and
wherein FETs configuring the current mirror circuit have back-gate terminals, and the back-gate terminals of the FETs are coupled in common and controlled simultaneously.

2. The bias circuit according to claim 1, wherein the current source is a constant current source.

3. The bias circuit according to claim 1, wherein the current source is a variable current source.

4. The bias circuit according to claim 1,
wherein the current mirror circuit is configured with P-type FETs, and
wherein a potential of the back-gate terminals of the FETs configuring the current mirror circuit is generated from a potential of a drain terminal of a diode-coupled FET configuring the current mirror circuit.

5. The bias circuit according to claim 1,
wherein the current mirror circuit is configured with P-type FETs, and
wherein a potential of the back-gate terminals of the FETs configuring the current mirror circuit is generated from a source terminal of another FET which is diode-coupled to a potential of drain terminals of the FETs configuring the current mirror circuit.

6. A bias circuit comprising:
an operational amplifier;
an FET which operates with an output of the operational amplifier inputted to a gate terminal of the FET;
a current mirror circuit for feeding back a current flowing through a drain terminal of the FET to the operational amplifier; and
an offset circuit for pulling out a current flowing through a back-gate terminal of the current mirror circuit,
wherein an output current of the current mirror circuit and an output current of the offset circuit are inputted to one input terminal of the operational amplifier, and an output current of a current source is inputted to the other input terminal, and
wherein FETs configuring the current mirror circuit have back-gate terminals, and the back-gate terminals of the FETs are coupled in common and controlled simultaneously.

7. A bias circuit comprising:
an operational amplifier;
a first FET which operates with an output of the operational amplifier inputted to a gate terminal of the first FET;
a first current mirror circuit for feeding back a current flowing through a drain terminal of the first FET to one input terminal of the operational amplifier; and
a second current mirror circuit which is coupled in parallel to the first current mirror circuit,
wherein a variable voltage is inputted to FETs configuring the first current mirror circuit, and a fixed voltage is inputted to FETs configuring the second current mirror circuit.

8. The bias circuit according to claim 7,
wherein the FETs configuring the first current mirror circuit and the FETs configuring the second current mirror circuit have back-gate terminals, and
wherein the back-gate terminals of the FETs configuring the first current mirror circuit and the FETs configuring the second current mirror circuit are at substantially the same potential.

9. The bias circuit according to claim 7, wherein a constant current source is coupled to the other input terminal of the operational amplifier.

10. The bias circuit according to claim 7, wherein a variable current source is coupled to the other input terminal of the operational amplifier.

11. The bias circuit according to claim 7, further comprising a second FET having a gate terminal to which a signal obtained by adding an output of the operational amplifier to an AC component of an RF signal is inputted,
wherein a drain terminal voltage of the second FET is the variable voltage.

12. The bias circuit according to claim 7, wherein a power supply voltage for driving the operational amplifier is the fixed voltage.

13. A power amplifier comprising the bias circuit according to claim 1.

* * * * *